United States Patent [19]
Honjo

[11] Patent Number: 5,177,452
[45] Date of Patent: Jan. 5, 1993

[54] STABILIZED CIRCUIT OF HIGH OUTPUT POWER TRANSISTOR FOR MICROWAVE AND MILLIWAVE

[75] Inventor: Kazuhiko Honjo, Tokyo, Japan

[73] Assignee: NEC Corporation, Tokyo, Japan

[21] Appl. No.: 628,474

[22] Filed: Dec. 14, 1990

[30] Foreign Application Priority Data

Dec. 25, 1989 [JP] Japan ................. 1-337414

[51] Int. Cl.[5] .............................................. H03F 3/16
[52] U.S. Cl. ...................................... 330/277; 330/306
[58] Field of Search ............... 330/277, 306, 286, 295, 330/302, 307

[56] References Cited

U.S. PATENT DOCUMENTS

| | | | |
|---|---|---|---|
| 3,860,881 | 1/1975 | Etherington et al. | 330/302 |
| 4,504,796 | 3/1985 | Igarashi | 330/277 |
| 4,590,437 | 5/1986 | Butler et al. | 330/277 |
| 4,638,261 | 1/1987 | McGuire et al. | 330/277 |
| 4,803,443 | 2/1989 | Takagi et al. | 330/277 |
| 4,878,033 | 10/1989 | Wong | 330/277 |
| 4,987,384 | 1/1991 | Yamanouchi et al. | 330/277 |
| 5,051,706 | 9/1991 | Zushi | 330/277 |
| 5,089,790 | 2/1992 | Mochizuki et al. | 330/277 |

FOREIGN PATENT DOCUMENTS

| | | | |
|---|---|---|---|
| 86208 | 12/1978 | Japan | 330/302 |
| 174806 | 1/1985 | Japan | 330/277 |

Primary Examiner—Paul M. Dzierzynski
Assistant Examiner—Tan Dinh
Attorney, Agent, or Firm—Laff, Whitesel, Conte & Saret

[57] ABSTRACT

An amplifier is comprised of a GaAsFET transistor connected between input matching circuit and output matching circuit for effecting amplification in microwave band and milliwave band. A filter circuit is interposed between the input matching circuit and a gate electrode of the transistor so as to selectively reduce an input impedance at $\frac{1}{2}$ frequency of the operation frequency to thereby stabilize the operation of the transistor.

3 Claims, 6 Drawing Sheets

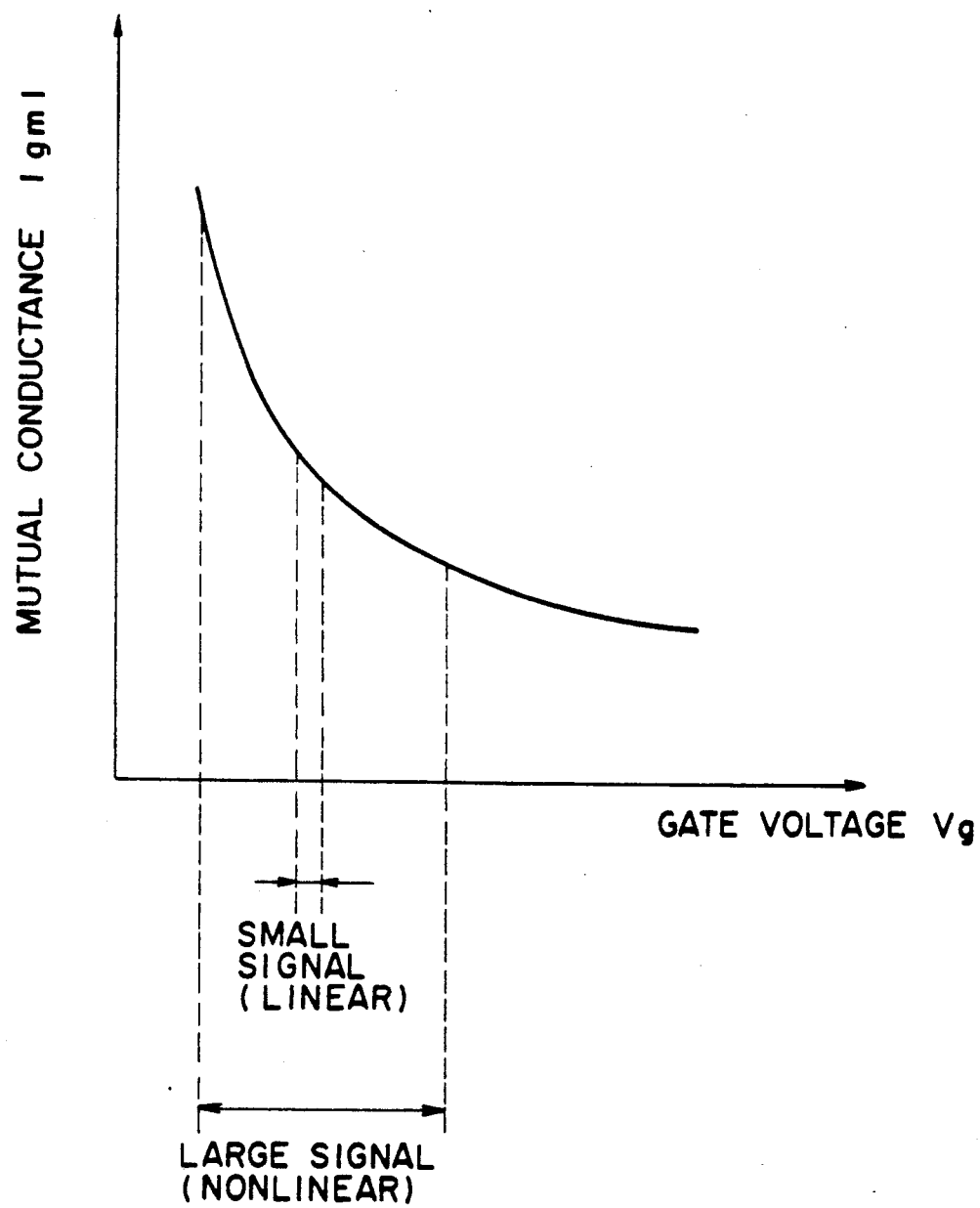

STABILIZED CIRCUIT OF HIGH OUTPUT POWER TRANSISTOR FOR MICROWAVE AND MILLIWAVE

BACKGROUND OF THE INVENTION

The present invention relates to a transistor circuit for microwave and millimeterwave, and more specifically relates to a particular type of the high output power transistor stabilized circuit for stable high power output operation.

There has been remarkably developed a high power output amplifier utilizing an active element such as GaAsFET for microwave and millimeterwave range, and such type of the solid state amplifier has been utilized in microwave communication, direct satellite broadcasting and radar system etc.

FIG. 3A shows an example of the conventional GaAsFET amplifier of high output power type. In the figure, a GaAsFET1 is soldered on a chip carrier, and a barium titanate substrate is soldered likewise. A gate electrode of the GaAsFET1 is connected by bonding wires 15 to an top electrode 3 of a first parallel-plate capacitor constructed on the substrate 2. The top electrode 3 is connected through bonding wires 11 to another top electrode 4 of a second parallel-plate capacitor constructed on the barium titanate substrate 2. An input terminal is composed of a 50Ω microstrip conductor 9 formed on an alumina ceramic substrate 17 soldered to the chip carrier. The strip conductor 9 is connected to the top electrode 4 through bonding wires 10. A drain electrode of the GaAsFET1 is connected through bonding wires 13 to an electrode pattern 6 formed on an alumina ceramic substrate 18 which is soldered on the chip carrier. Numeral 7 indicates a stub, and numeral 8 indicates an output terminal. FIG. 3B shows an equivalent circuit of the FIG. 3A structure. The same reference numerals indicate the same components in FIGS. 3A and 3B.

The conventional GaAsFET high power output amplifier shown in FIG. 3A incidentally generates abnormal amplification phenomenon as illustrated in FIGS. 4A and 4B. FIG. 4A shows input-output power response of the amplifier, and FIG. 4B shows frequency-output power characteristic of the amplifier. As shown in FIG. 4A, jumping of the input-output power response occurs with hysteresis at a particular frequency range within an amplification frequency band. Occurrence of such jumping may generate subharmonic wave typically having a half frequency of the operation frequency. As shown in FIG. 4B, the jumping phenomenon occurs when an input power level exceeds a certain value. When the input power level is raised further, a jumping amount may rather decrease in the frequency characteristic curve.

The jumping phenomenon may occur according to the following mechanism. Namely, the jumping can be explained in terms of mutual interaction between nonlinearity of the GaAsFET and feedback capacitances of the GaAsFET and peripheral circuits. Firstly, the description is given for the nonlinearity of the GaAsFET. As shown in FIG. 5, a drain current $I_D$ of the GaAsFET is represented by using saturation velocity (Vsat) model as follows:

$$I_D = qV_{sat}b(a-w)N_o \qquad 1$$

where q denotes a charge of electron, w denotes a width of a depletion layer, a denotes a channel thickness, b denotes a gate width, and No denotes a doping density. The depletion layer width w is represented by the following relation 2:

$$w = \sqrt{\frac{2\epsilon(V_g - V_{bi})}{qN_o}} \qquad 2$$

where $V_g$ indicates a gate voltage, $V_{bi}$ indicates a builtin voltage of Schottky junction, and $\epsilon$ indicates a dielectric constant of GaAs. A mutual conductance $g_m$ is represented by using the relations 1 and 2 as follows:

$$g_m = \frac{dI_D}{dV_g} = \frac{dI_D}{dw} \cdot \frac{dw}{dV_g} = \frac{bV_{sat}}{2}\sqrt{\frac{2\epsilon N_o q}{V_g - V_{bi}}} \qquad 3$$

By the way, FIG. 5 is a schematic diagram of a GaAsFET provided with a gate Schottky metal 21 formed on an n-type doped layer 24 of the recess-shape over a GaAs substrate 25 of semi-insulative type. Numerals 22 and 23 denote, respectively, a source electrode and a drain electrode composed of ohomic metal.

The mutual conductance $g_m$ represented by the relation 3 has a $V_g$-dependency as shown in FIG. 6. Substantial linearity may be held for small signal operation, while nonlinearity may become remarkable for large signal operation. As shown in FIG. 5, there exist a drain-gate capacitance Cdg (referred to by numeral 28) caused by the depletion layer, and a drain-gate capacitance Cdg' (referred to by numeral 27) due to coupling between electrodes. These capacitances constitute a feedback circuit between input and output. FIGS. 7A and 7B are an equivalent expression of the above noted nonlinearity and the feedback circuit. In these figures, a nonlinear model includes a GaAsFET 37, an input circuit 38 and an output circuit 39, and is represented by a mixing function 32 based on the nonlinearity of $g_m$, an amplification function 31 inherent to the transistor, and a feedback circuit 33 through Cdg+Cdg'. In the figures, numeral 34 denotes an impedance of a signal source for the GaAsFET. FIG. 8 illustrates operation of the nonlinear circuit having the feedback circuit. Namely, a fo component inputted into the amplifier is mixed with a fo/2 frequency component of thermal noise which occurs in the feedback loop so as to produce a fo/2 component. This newly regenerated fo/2 component is amplified to pass through the feedback loop to thereby again mix with the fo input component. The fo/2 component grows until its amplitude reaches a saturation level of the system. Consequently, the output has both of the fo component and fo/2 component. The condition for such regenerative divisional phenomenon is represented by:

$$G_{A,fo/2} + G_{F,fo/2} + G_C(Pi) > 0dB \qquad 4$$

where $G_{A,fo/2}$ indicates a gain of the amplifying portion for the fo/2 component, $G_{F,fo/2}$ denotes a feedback amount of the feedback circuit for the fo/2 component, and $G_C(Pi)$ denotes a conversion gain of the mixing portion. As shown in FIG. 6, the value of $G_C(Pi)$ is quite small for small signal operation since it can be treated substantially linearly. Therefore, the condition represented by the relation 4 may not be satisfied when the small signal operation is undertaken. On the other hand, in the range of large signal operation, the value of $G_C(Pi)$ abruptly increases to satisfy the relation 4. At this time, the output power becomes $Pout=P_{fo}+P_{fo/2}$. The saturation output of the system is determined by sum of the fo component and fo/2 component. Therefore, at the moment when the fo/2 component occurs (namely when the relation 4 is satisfied), the other fo component decreases instantly, thereby causing the before-mentioned jumping of the input-output power response.

SUMMARY OF THE INVENTION

An object of the present invention is to eliminate the above noted abnormal phenomenon in the high power output transistor amplifier for microwave and millimeterwave and to provide a stabilized circuit of the high output power microwave and millimeterwave transistor.

In order to achieve the above noted object, the inventive stabilized circuit of the high output power microwave and millimeterwave transistor includes an input matching circuit and an output matching circuit. The stabilized circuit is comprised of a filter circuit connected between an input terminal of the microwave and milliwave transistor and the input matching circuit for selectively reducing an impedance with respect to a ½ frequency of an operation frequency.

Preferably, the filter circuit is comprised of a parallel transmission line dimensioned to effect top end opening at ½ wavelength with respect to the operation frequency (namely, ¼ wavelength with respect to ½ frequency of the operation frequency).

According to the present invention, in the FIG. 7 circuit, the feedback amount $G_{F fo/2}$ for the fo/2 component is represented by:

$$G_{F fo/2} \sim 20 \log \frac{Z_{fo/2}}{Z_{fo/2} + Z_{F fo/2}} \quad 5$$

In the relation 5, $Z_{fo/2}=0$ is held so that $G_{F fo/2}$ is made $-\infty$ to thereby avoid satisfaction of the conditional relation 4. A transmission line of top end opening at ½ wavelength relative to the basic wave fo has an impedance ∞ when observed from the other end. However, the transmission line becomes a ¼ wavelength transmission line of another end open and therefore has zero impedance when observed from the other end. Consequently, the matching circuit of the basic wave is not affected at all, while the impedance is made zero for the fo/2 component, thereby $G_{F fo/2}$ being set to $-\infty$ to avoid generation of the abnormal phenomenon.

BRIEF DESCRIPTION OF THE DRAWINGS

FIGS. 6-8 are graphs explaining the abnormal phenomenon.

DETAILED DESCRIPTION OF EMBODIMENTS

Figure 1:
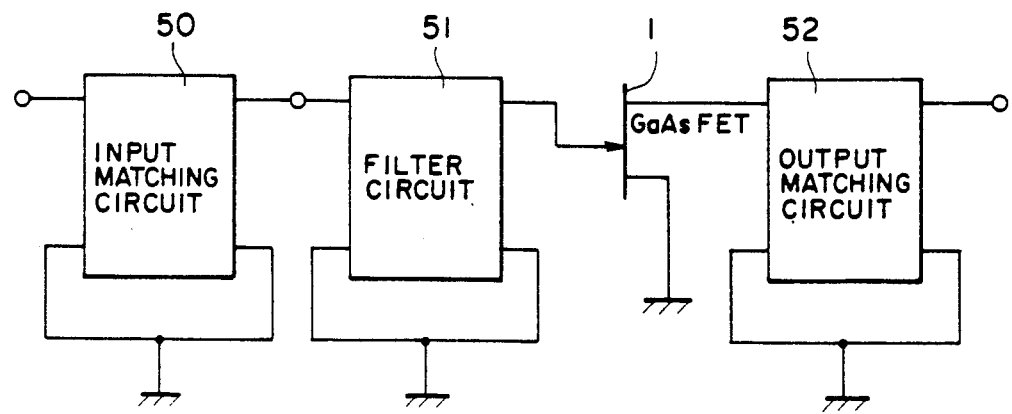
FIG. 1 is a diagram showing the inventive circuit.
Figure 5:
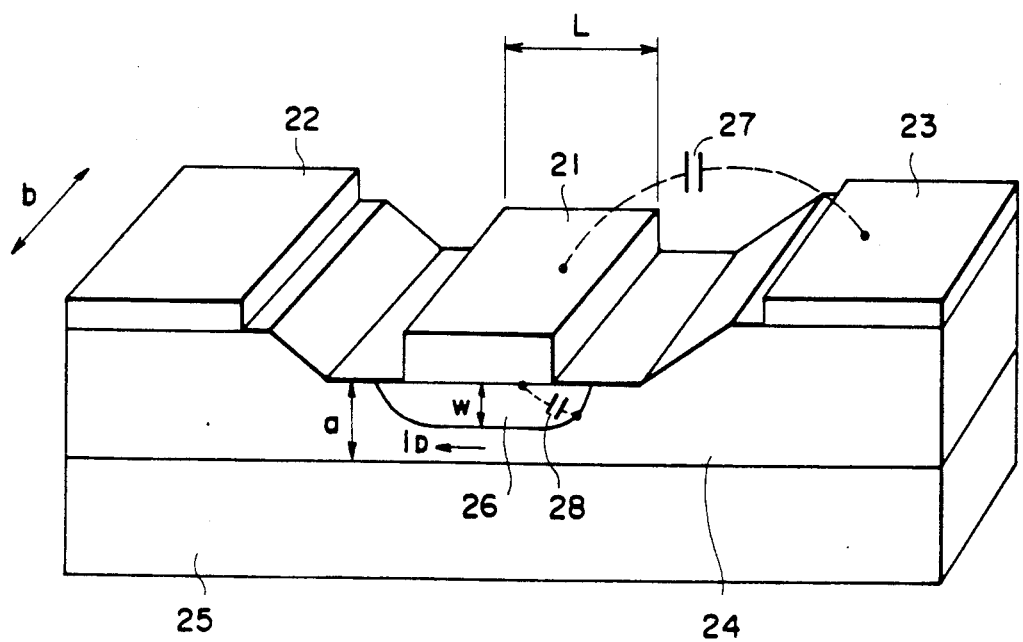
FIG. 5 is a structural view of a high output power GaAsFET.

FIG. 1 shows the inventive stabilized circuit of an high output power microwave and millimeterwave transistor, where numeral 50 denotes an input matching circuit for a basic wave, numeral 52 denotes an output matching circuit for the basic wave, numeral 51 denotes a filter circuit which is made short for the fo/2 component while not affecting the basic wave, and numeral 1 denotes a GaAsFET.

Figure 2A:
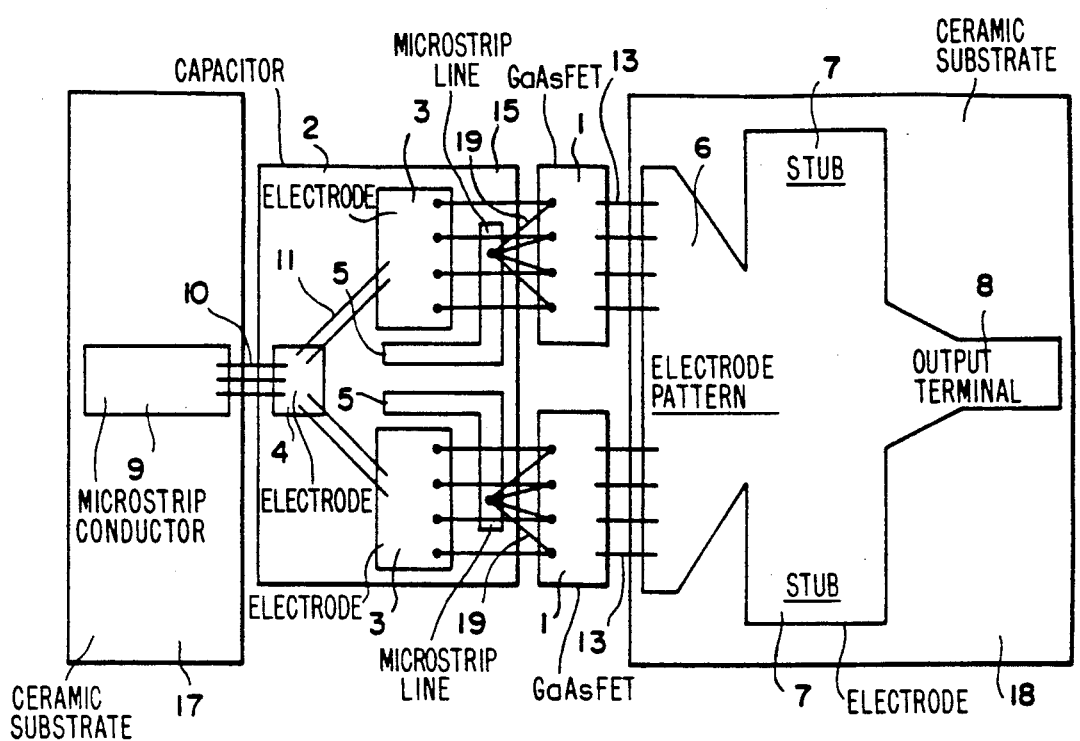
FIG. 2A is a detailed circuit diagram of one embodiment of the inventive circuit.
Figure 2B:
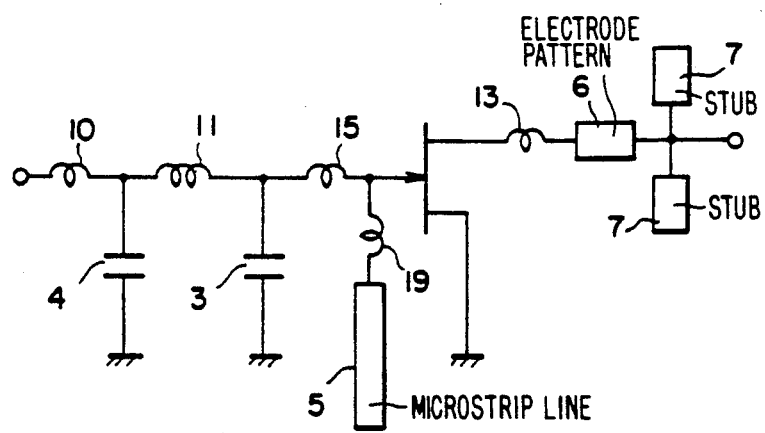
FIG. 2B is an equivalent circuit for FIG. 2A.
Figure 3A:
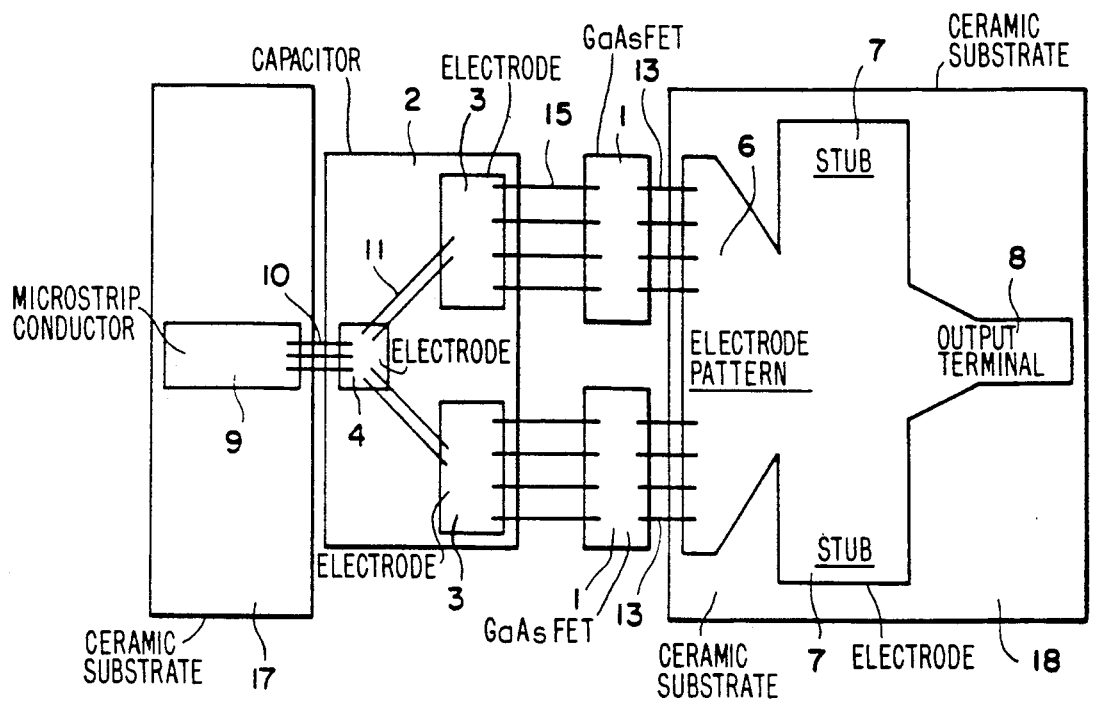
FIGS. 3A and 3B are a diagram showing the prior art circuit.
Figure 3B:
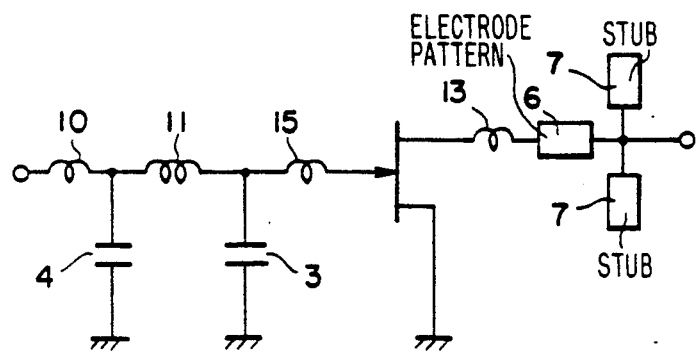
Figure 4A:
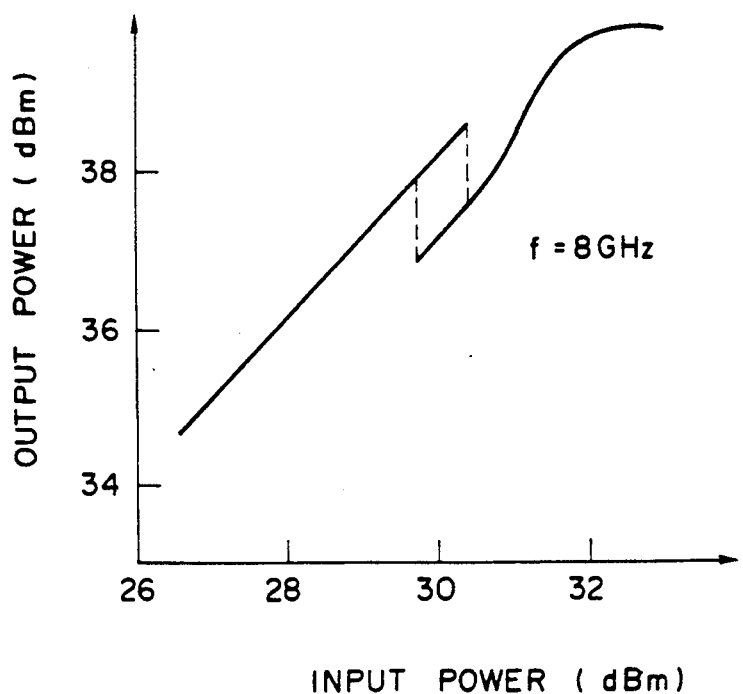
FIGS. 4A and 4B are a diagram illustrative of abnormal phenomenon observed in the prior art.
Figure 4B:
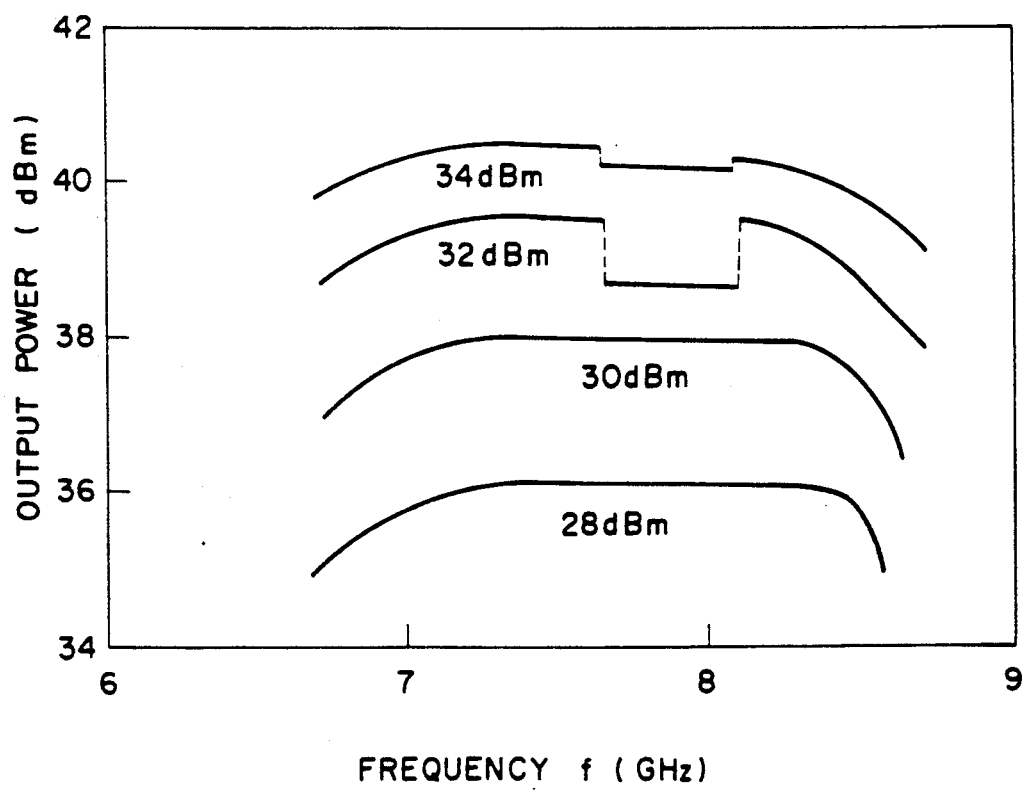
Figure 7A:
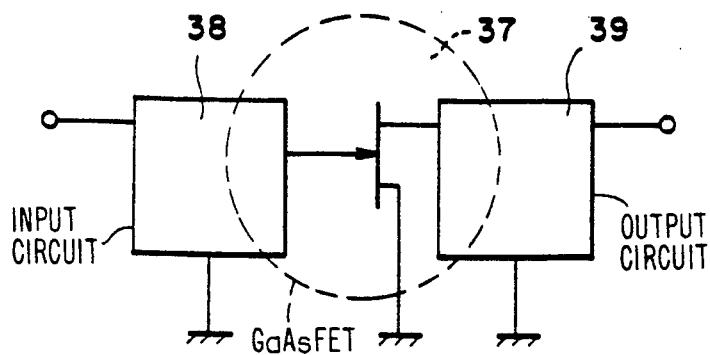
Figure 7B:
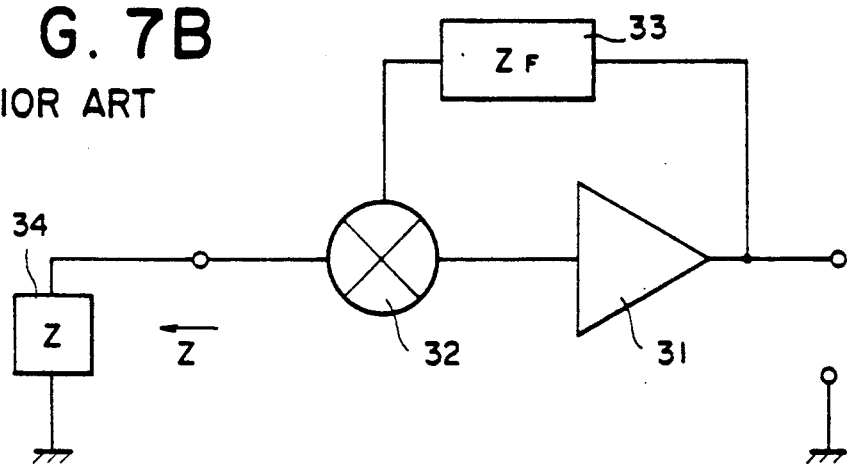
Figure 8:
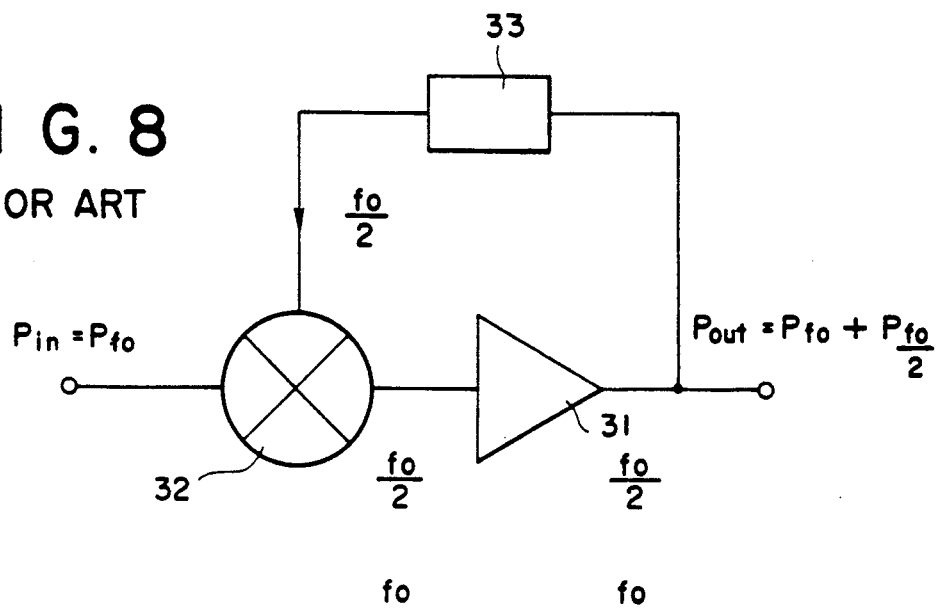

FIG. 2 shows one embodiment of the invention. The difference between the FIG. 2 embodiment and the FIG. 3A prior art is in that a micro strip line 5 of top end open for ½ wavelength of the basic wave is newly added, and new bondings 19 are connected between the strip line 5 and the gate electrode of the GaAsFET. The remaining reference numerals denote the same components as in the FIG. 3A prior art.

In the inventive high output power microwave and milliwave transistor stabilized circuit, feedback of the fo/2 component is blocked so as to eliminate jumping phenomenon of the input-output power response and band cut phenomenon in the frequency characteristic. Accordingly, yield of the microwave and milliwave high output power amplifier can be greatly improved. Moreover, there can be provided the amplifier stable at millimeterwave band in which the feedback amount particularly increases.

What is claimed is:

1. An amplifier circuit comprising: an input matching circuit; an output matching circuit; a transistor having both internal feedback and nonlinear characteristics connected between said input matching circuit and said output matching circuit for effecting an amplification in microwave and millimeter wave length bands; and a filter circuit disposed between said input matching circuit and an input terminal of said transistor, said filter circuit having filter characteristics such that the impedance is substantially ∞ Ω at $f_0$ and 0Ω at $f_0/2$ and being operative to selectively reduce an impedance for a frequency which is ½ of an operation frequency to stabilize an operation of the transistor.

2. An amplifier circuit according to claim 1 wherein said filter circuit comprises a parallel transmission line of a top end open type at ½ wavelength of the operating frequency.

3. An amplifier circuit comprising: a chip carrier, a FET soldered on said chip carrier, a first parallel-plate capacitor on a first substrate which is soldered on said chip carrier, a gate electrode of said FET being connected by bounding wires to a top electrode of said first capacitor, a second parallel-plate capacitor constructed on said first substrate, said top electrode being connected through bonding wires to another top electrode of said second capacitor, a micro strip conductor formed on a second substrate which is soldered to said chip carrier, an input terminal comprising said micro strip conductor, said micro strip conductor being connected through bonding wires to another top electrode of said a second parallel-plate capacitor, an electrode pattern formed on a third substrate which is soldered on said chip carrier, said electrode pattern having a stub and an output terminal, a drain electrode of said FET being connected through bonding wires to said electrode pattern, and a micro strip lead having a top end which is open for ½ wavelength of a basic wave of said amplifier, said micro strip being connected by a bonding wire to the gate electrode of said FET.

* * * * *